United States Patent
Akselrod et al.

(10) Patent No.: US 7,098,470 B2
(45) Date of Patent: *Aug. 29, 2006

(54) METHOD FOR NON-DESTRUCTIVE MEASURING OF RADIATION DOSE

(75) Inventors: Mark S. Akselrod, Stillwater, OK (US); Anne E. Akselrod, Stillwater, OK (US)

(73) Assignee: Landauer, Inc., Glenwood, IL (US)

( * ) Notice: Subject to any disclaimer, the term of this patent is extended or adjusted under 35 U.S.C. 154(b) by 292 days.

This patent is subject to a terminal disclaimer.

(21) Appl. No.: 10/768,094

(22) Filed: Feb. 2, 2004

(65) Prior Publication Data

US 2004/0159803 A1    Aug. 19, 2004

Related U.S. Application Data

(63) Continuation-in-part of application No. 10/309,021, filed on Dec. 4, 2002, now Pat. No. 6,846,434.

(60) Provisional application No. 60/336,749, filed on Dec. 4, 2001, now abandoned, provisional application No. 60/417,153, filed on Oct. 10, 2002.

(51) Int. Cl.
*G01N 23/04* (2006.01)

(52) U.S. Cl. ........................................ 250/581

(58) Field of Classification Search ................. 250/581
See application file for complete search history.

(56) References Cited

U.S. PATENT DOCUMENTS

| | | | |
|---|---|---|---|
| 4,186,046 A | 1/1980 | DeLai et al. |
| 4,292,374 A | 9/1981 | Nishizawa et al. |
| 4,533,489 A | 8/1985 | Utts et al. |
| 4,573,768 A | 3/1986 | Polak et al. |
| 4,642,799 A | 2/1987 | Glass |
| 4,954,707 A | 9/1990 | Miller et al. |
| 5,025,159 A | 6/1991 | Miller et al. |
| 5,109,586 A | 5/1992 | Jones et al. |
| 5,136,163 A | 8/1992 | Miller et al. |
| 5,272,348 A | 12/1993 | Miller |
| 5,354,997 A | 10/1994 | Miller |
| 5,424,006 A | 6/1995 | Murayama et al. |
| 5,567,948 A | 10/1996 | Miller |
| 5,569,927 A | 10/1996 | Miller |
| 5,616,285 A | 4/1997 | Zhang |
| 5,622,659 A | 4/1997 | Spicuzza |
| 5,702,654 A | 12/1997 | Chen et al. |
| 5,755,999 A | 5/1998 | Shi et al. |
| 5,932,363 A | 8/1999 | Hu et al. |
| 5,981,415 A | 11/1999 | Waku et al. |
| 5,993,545 A | 11/1999 | Lupton et al. |

(Continued)

*Primary Examiner*—David Porta
*Assistant Examiner*—Mindy Vu
(74) *Attorney, Agent, or Firm*—Jagtiani + Guttag

(57) ABSTRACT

The invention presents a method of radiation dosimetry and radiation field imaging. It utilizes luminescent material based on aluminum oxide doped with carbon and magnesium ($Al_2O_3$:C,Mg) and containing aggregate oxygen vacancy defects. Storage of dosimetric information is based on ionization of the crystal matrix, generation of free electrons and capture of electrons and holes by traps and color centers. An absorbed dose is determined by non-destructive readout of fluorescence from color centers induced by radiation. The preferred mode of measurements is to illuminate the $Al_2O_3$:C,Mg phosphor with a red laser (at 635 or 650 nm) and to measure the intensity of 750 nm fluorescence. Method allows for high temperature and environmental stability of dose information. The detector material is insensitive to room light before and after the irradiation and provides a fast data rate during scanning for imaging of radiation fields.

28 Claims, 9 Drawing Sheets

U.S. PATENT DOCUMENTS

| | | |
|---|---|---|
| 6,010,761 A | 1/2000 | Tatewaki et al. |
| 6,074,477 A | 6/2000 | Imaeda et al. |
| 6,125,095 A | 9/2000 | Gemma et al. |
| 6,207,077 B1 | 3/2001 | Burnell-Jones |
| 6,267,911 B1 | 7/2001 | Yen et al. |
| 6,278,679 B1 | 8/2001 | Weiss et al. |
| 6,281,171 B1 | 8/2001 | Ihara et al. |
| 6,302,959 B1 | 10/2001 | Srivastava et al. |
| 6,322,910 B1 | 11/2001 | Arai et al. |
| 6,379,583 B1 | 4/2002 | Gray et al. |
| 6,399,223 B1 | 6/2002 | Fujita et al. |
| 6,402,987 B1 | 6/2002 | Srivastava et al. |
| 6,414,324 B1 | 7/2002 | Colyott et al. |
| 6,414,754 B1 | 7/2002 | Johnson |
| 6,440,588 B1 | 8/2002 | Matsuoka et al. |
| 6,456,005 B1 | 9/2002 | Panchula et al. |
| 6,458,731 B1 | 10/2002 | Rosenflanz |
| 6,472,711 B1 | 10/2002 | Shiota |
| 6,475,942 B1 | 11/2002 | Brewer et al. |
| 6,475,951 B1 | 11/2002 | Domesle et al. |

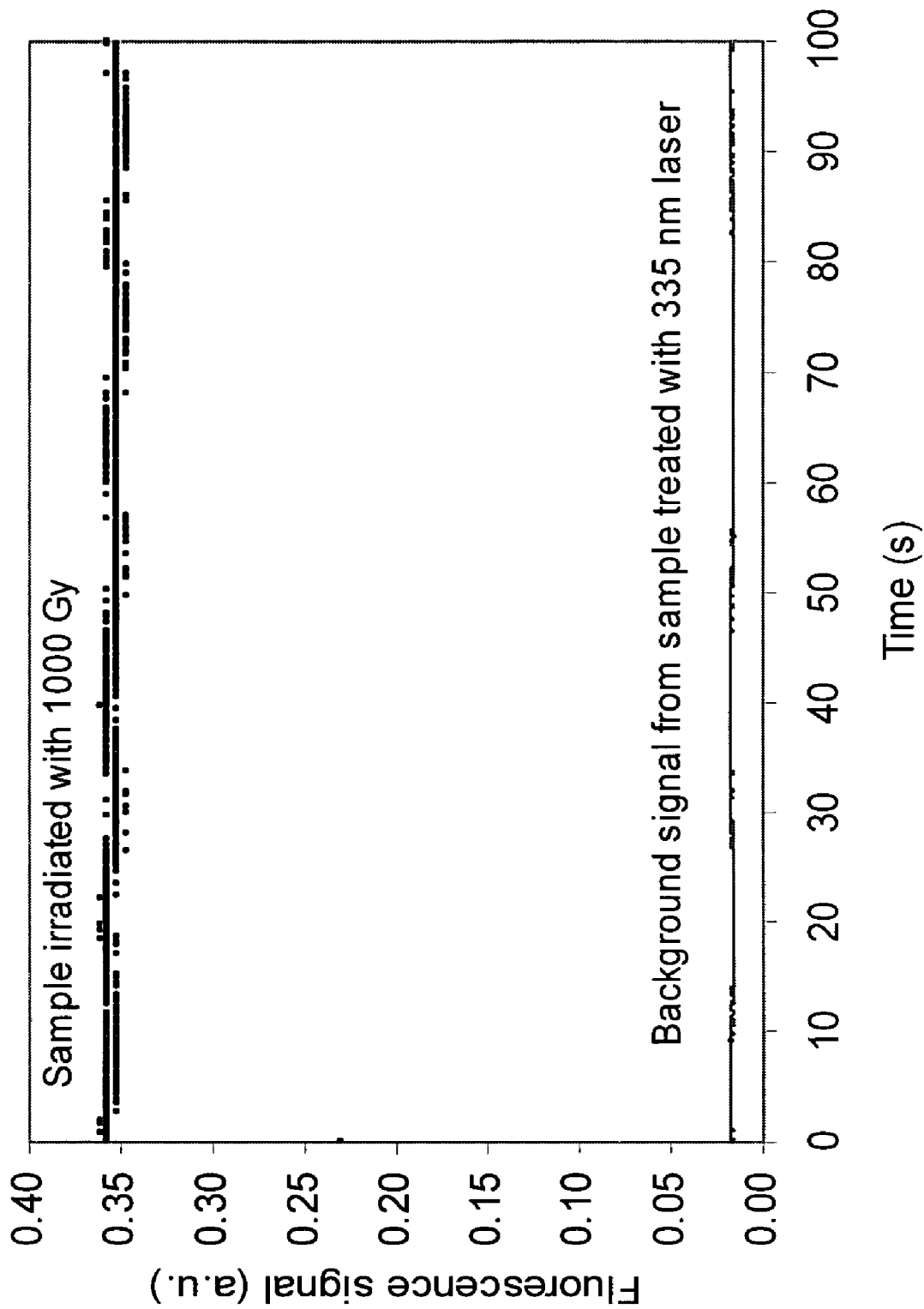

METHOD FOR NON-DESTRUCTIVE MEASURING OF RADIATION DOSE

CROSS-REFERENCE TO RELATED APPLICATIONS

This application is a continuation-in-part of U.S. application Ser. No. 10/309,021, filed Dec. 4, 2002 now U.S. Pat. No. 6,846,434, entitled, "Aluminum Oxide Material for Optical Data Storage," which claims the priority of U.S. Provisional App. No. 60/336,749, filed Dec. 4, 2001, now abandoned, and U.S. application Ser. No. 10/309,179, filed Dec. 4, 2002, entitled, "Method for Forming Aluminum Oxide Material Used in Optical Data Storage," which claims the priority of U.S. Provisional App. No. 60/417,153, filed Oct. 10, 2002, U.S. application Ser. No. 10/419,726 filed Apr. 22, 2003, entitled "Confocal One-Bit Recording and Fluorescent Readout Utilizing Aluminum Oxide Single Crystals," and U.S. application Ser. No. 10/633,654 filed Aug. 5, 2003, entitled "Bit-Wise Optical Data Storage Utilizing Aluminum Oxide Single Crystal Medium." The entire disclosures and contents of the above applications are hereby incorporated by reference.

BACKGROUND OF THE INVENTION

1. Field of the Invention

The present invention relates to radiation dosimetry techniques.

2. Description of the Prior Art

Different applications require different types of radiation dosimetry techniques. Active dosimetry including gas counters, scintillator detectors and electronic dosimeters based on p-i-n semiconductor diodes allow for instant monitoring of radiation dose and dose rates, but are relatively expensive. Passive radiation detectors and techniques for measuring the acquired doses are simpler and provide less expensive solutions for low risk radiation environments. Some currently used passive detector technologies are: photographic and photochromic films, radio-photoluminescent (RPL) glasses, thermoluminescent detectors (TLD) and optically stimulated luminescent (OSL) detectors. The first three technologies allow for non-destructive and multiple readout but do not provide high sensitivity of radiation dose measurements. The last two (TLD and OSL) provide extremely high sensitivity and wide dynamic range but the readout is destructive.

Therefore, there exists a need for better method of measuring a dose of ionizing radiation.

SUMMARY OF THE INVENTION

It is therefore an object of the present invention to provide a method of passive radiation dosimetry to precisely obtain radiation doses and images of radiation fields.

It is a further object of the present invention to provide a method of passive radiation dosimetry that is based on fundamentally very fast electronic processes.

It is yet another object of the present invention to use a crystalline luminescent material as a passive integrating sensor in radiation dosimetry and radiation field imaging.

It is yet another object of the present invention to provide a method of radiation dosimetry that only requires low laser light energies for retrieving the latent information.

It is yet another object of the present invention to provide a method and crystalline luminescent material that may be employed in radiation dose measurements at extremely high temperature and long storage time.

It is yet another object of the present invention to provide a method and crystalline luminescent material that may be employed in radiation dose measurements with minimal degradation of luminescent signal after multiple readout cycles.

It is yet another object of the present invention to provide a fast and essentially nondestructive measurement of a radiation dose.

It is yet another object of the present invention to provide a method of radiation field imaging that only requires low laser light energies for retrieving the latent information.

It is yet another object of the present invention to provide a fast and essentially nondestructive readout of a radiation field image.

It is yet another object of the present invention to provide an optical method of erasing stored information and restoring essentially initial dosimetric properties of a luminescent material.

It is yet another object of the present invention to provide a thermal method of erasing stored information and restoring essentially initial dosimetric properties of a luminescent material.

According to a first broad aspect of the present invention, there is provided a method of measuring a dose of ionizing radiation comprising the following steps: (a) exposing a luminescent material to ionizing radiation to form an irradiated luminescent material; (b) exposing the irradiated luminescent material to a light source to form an excited luminescent material; (c) detecting fluorescent light emitted by the excited luminescent material to thereby determine the amount of fluorescent light emission induced by step (a); and (d) determining the dose of ionizing radiation from the amount of fluorescent light detected in step (c) using calibration data, wherein the luminescent material comprises: a base material comprising $Al_2O_3$, a first dopant comprising Mg, and a second dopant comprising C and wherein the luminescent material has at least one type of aggregate oxygen vacancy defect.

According to a second broad aspect of the present invention, there is provided a method of erasing dosimetric information comprising the following steps: (a) providing an irradiated luminescent material including color centers induced by radiation; and (b) illuminating the irradiated luminescent material with light having sufficient intensity to perform a two-photon absorption and ionization of the color centers induced by radiation, wherein the luminescent material comprises: a base material comprising $Al_2O_3$, a first dopant comprising Mg, and a second dopant comprising C and wherein the luminescent material has at least one type of aggregate oxygen vacancy defect.

According to a third broad aspect of the present invention, there is provided method of erasing dosimetric information comprising the following steps: (a) providing an irradiated luminescent material including color centers induced by radiation; and (b) annealing the irradiated luminescent material at 680±50° C. for at least 1 minute to empty deep traps filled during irradiation, wherein the luminescent material comprises: a base material comprising $Al_2O_3$, a first dopant comprising Mg, and a second dopant comprising C.

According to a fourth broad aspect of the present invention, there is provided a method of obtaining radiation field image comprising the following steps: (a) exposing at least one imaging plate in a radiation field to form at least one irradiated imaging plate; (b) exposing the irradiated imaging plate to a light source to form a light exposed imaging plate;

and (c) measuring spatial distribution of fluorescent light produced by the imaging plate to obtain the radiation field image, wherein the imaging plate is comprised of a luminescent material, the luminescent material comprising: a base material comprising $Al_2O_3$, a first dopant comprising Mg, and a second dopant comprising C and wherein the luminescent materials has at least one type of aggregate oxygen vacancy defect.

Other objects and features of the present invention will be apparent from the following detailed description of the preferred embodiment.

BRIEF DESCRIPTION OF THE DRAWINGS

The invention will be described in conjunction with the accompanying drawings, in which:

FIG. 9 is a graph showing a continuous non-destructive readout of 750 nm fluorescence induced by radiation and stimulated by red (650 nm) laser diode.

DETAILED DESCRIPTION OF THE PREFERRED EMBODIMENT

Figure 1:
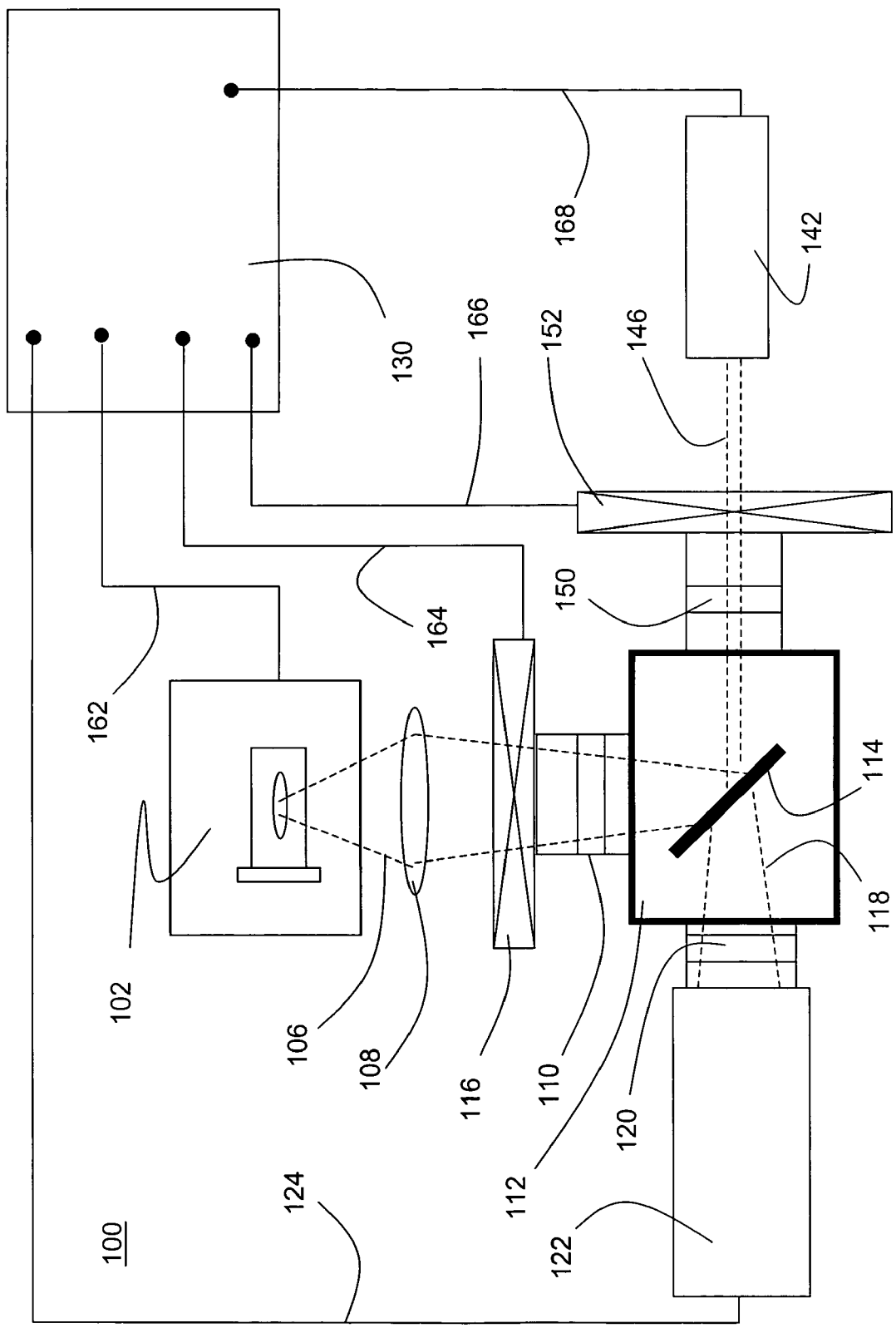
FIG. 1 is a schematic diagram of an experimental setup to measure radiation doses using aluminum oxide and non-destructive fluorescent techniques.

It is advantageous to define several terms before describing the invention. It should be appreciated that the following definitions are used throughout this application.

DEFINITIONS

Where the definition of terms departs from the commonly used meaning of the term, applicant intends to utilize the definitions provided below, unless specifically indicated.

For the purposes of the present invention, the term "dosimetric information" refers to the number of oxygen vacancy defects of interest present in a luminescent material that allow determination of a radiation dose to which the luminescent material has been exposed to be determined according to the methods of the present invention. For example, the number of Type I and Type II color centers present in a luminescent material is dosimetric information, because a decrease in the number of Type I color centers or an increase in the number of Type II color centers can be used to determine the dose of ionizing radiation to which a luminescent material of the present invention has been exposed.

For the purposes of the present invention, the term "parts per million (ppm)" when referring to a compound that is part of a mixture prior to crystallization refers to the weight ratio of that compound to the weight of the mixture as a whole. For the purposes of the present invention, the term "parts per million (ppm)" when referring to an element present in a mixture prior to crystallization refers to the weight ratio of the compound or the molecule containing that element to the weight of the mixture as a whole. For example, if Mg is present in a mixture prior to crystallization at a concentration of 500 ppm and Mg is present in the mixture as MgO, MgO is present at a concentration of 500 ppm of the total weight of the mixture. For the purposes of the present invention, the term "parts per million (ppm)" when referring to an element present in a crystal refers to the weight ratio of the element to weight of the crystal as a whole. For example, if Mg is present in a crystal at 27 ppm, this indicates that the element Mg is present in the crystal at a concentration of 27 ppm of the total weight of the crystal.

For the purposes of the present invention, the term "absorption band in the region of" or "emission band in the region of" refers to an absorption or emission band having a peak in the appropriate region. Sometimes the region may be a particular wavelength and sometimes the region may include a range of wavelengths indicating a possible shift in a band peak position, for example, as a result of a temperature change.

For the purposes of the present invention, the term "crystalline material" refers to the conventional meaning of the term "crystalline material", i.e. any material that has orderly or periodic arrangement of atoms in its structure.

For the purposes of the present invention, the term "defect" refers to the conventional meaning of the term "defect" with respect to the lattice of a crystal, i.e. a vacancy, interstitial, impurity atom or any other imperfection in the lattice of a crystal.

For the purposes of the present invention, the term "oxygen vacancy defect" refers to a defect caused by an oxygen vacancy in a lattice of a crystalline material. An oxygen vacancy defect may be a single oxygen vacancy defect, a double oxygen defect, a triple oxygen vacancy defect, or more than triple oxygen vacancy defect. An oxygen vacancy defect may be associated with one or more impurity atoms or may be associated with an interstitial intrinsic defect such as misplaced interstitial oxygen atoms. Occupancy of an oxygen vacancy by two electrons gives rise to a neutral F-center, whereas occupancy of any oxygen vacancy by one electron forms an F$^+$-center. An F$^+$-center has a positive charge, with respect to the lattice. A cluster of oxygen vacancy defects formed by double oxygen vacancies is referred to as an $F_2$-type center. A cluster of oxygen vacancy defects formed by two F$^+$-centers and charge-compensated by two Mg-impurity atoms is referred to as a $F_2^{2+}(2Mg)$-center.

For the purposes of the present invention, the term "F-type center" refers to any one of the following centers: F-center, F$^+$-center, $F_2$$^+$-center, $F_2$$^{2+}$-center, $F_2^+(2Mg)$-center, $F_2^{2+}(2Mg)$-center, etc.

For the purposes of the present invention, the term "color center" refers to the conventional meaning of the term "color center", i.e. a point defect in a crystal lattice that gives rise to an optical absorption of a crystal and upon light excitation produces a photon of luminescence. A color center, an impurity or an intrinsic defect in a crystalline material creates an unstable species. An electron localized on this unstable species or defect performs quantum transition to an excited state by absorbing a photon of light and performs quantum transition back to a ground state by emitting a photon of luminescence.

For the purposes of the present invention, the term "luminescence lifetime" or "fluorescence lifetime" refers to a time constant of an exponential decay of luminescence or fluorescence.

For the purposes of the present invention, the term "wide emission band" refers to an emission band that has full width at half maximum bigger than 0.1 eV and is a result of strong electron-phonon interaction. One example of a wide emission band is the wide emission band around 335 nm.

For the purposes of the present invention, the term "charge-compensated" refers to a defect in a crystal lattice that electrostatically compensates the electrical charge of another defect. For example, Mg and C impurities may be used to charge-compensate one oxygen vacancy defect, two oxygen vacancy defects, a cluster of these defects, etc. comprising $F_2^{2+}$(2Mg)-centers.

For the purposes of the present invention, the term "ionizing radiation" refers to any particulate or electromagnetic radiation that is capable of dissociating atoms into ions and electrons. The present invention may be used to determine doses of both directly ionizing radiation and indirectly ionizing radiation.

For the purposes of the present invention, the term "directly ionizing radiation" refers to fast charge particles such as: fast electrons/beta particles, helium ions/alpha particles, hydrogen ions/protons, heavy ions, etc.

For the purposes of the present invention, the term "indirectly ionizing radiation" refers to X-rays, gamma photons, or neutrons.

For the purposes of the present invention, the term "substantially insensitive to room light" refers to a crystalline material that does not change significantly its coloration or concentration of electrons on traps (concentration of unstable species) under ambient light conditions or conditions typically present inside a room or a building.

For the purposes of the present invention, the term "capable of being used for long-term storage" refers to a crystalline material that does not change significantly its coloration or concentration of electrons on traps (concentration of unstable species) at ambient temperatures.

For the purposes of the present invention, the term "fluorescence yield" refers to the parameter determined as a ratio of the number of photons emitted by a luminescent material to the number of photons absorbed by this fluorescent material.

For the purposes of the present invention, the term "electron trap" refers to a structural defect in a crystal lattice able to create a localized electronic state and capable of capturing free electrons from a conduction band of the crystalline material.

For the purposes of the present invention, the term "hole trap" refers to a structural defect in a crystal lattice able to create a localized electronic state and capable of capturing free holes from a conduction band of the crystalline material.

For the purposes of the present invention, the term "deep trap" refers to an electron or hole trap having a thermal activation energy bigger than kT, where T is absolute temperature of the crystal and k is Boltzmann's constant.

DESCRIPTION

The present invention relates to a technique for radiation dosimetry using a luminescent material and, more specifically, to a method of determining a dose of x-rays, gamma, and beta radiation using a luminescent material and a fluorescent readout technique.

Goals of the present invention include utilization of new radiation sensitive luminescent material and optical measurement technique that provides simultaneously high sensitivity and non-destructive multiple readout, temperature stability of information up to 600° C., essentially no sensitivity to ambient light and at the same time capability for optical and thermal erasure of stored information. These advantages are important when comparing the present invention with known dosimetry techniques briefly described below.

Radio-photoluminescent glasses (RPL) stimulated with short UV pulses is a non-destructive way to perform dosimetric measurements when extremely high sensitivity is not required and total accumulated dose has to be monitored non-destructively. Time-discrimination technique and highly polished glass detectors are required, see E. Piesch et al., "Properties of radiophotoluminescent glass dosimeter systems using pulsed laser UV excitation," Radiat. Prot. Dosim. v. 17, p. 293–297 (1986), the entire contents and disclosures of which are hereby incorporated by reference.

Thermoluminescent dosimetry (TLD) utilizes crystalline and glass materials able to trap electrons and holes generated within the detector during irradiation, store dosimetric information for a long time. To measure an accumulated dose a TL detector is heated in a reader and emits a luminescent light in an amount that is proportional to the absorbed dose. TLD is used for personnel radiation monitoring and medical doses verification. TLD is a destructive technique and requires heating of a detector. TLD is also slow and is not suitable for high spatial resolution imaging.

Optically Stimulated Luminescence (OSL) utilizes materials and electronic processes similar to TLD but interrogation of the detector is performed by light instead of heat. Precise delivery of light, simpler readers and fast readout times are the main advantages of OSL in comparison with TLD. OSL allows for reread of the detector several times, but it is still a destructive technique. Recently a new pulsed-OSL technique for radiation dosimetry using anion-deficient $Al_2O_3$ has been developed and commercially implemented in LUXEL technology by Landauer, Inc. In this technology the laser stimulation is pulsed and the OSL is measured after each pulse. See U.S. Pat. No. 5,892,234 to McKeever, et al., U.S. Pat. No. 5,962,857 to McKeever, et al., and International Publication Number WO 98/12575 Mar. 26, 1998, M. S. Akselrod and S. W. S. McKeever, "A Radiation Dosimetry Method Using Pulsed Optically Stimulated Luminescence," Radiat. Prot. Dosim. v. 81, No 3, 167–176 (1999), S. W. S. McKeever, M. S. Akselrod and B. G. Markey, "Pulsed Optically Stimulated Luminescence Dosimetry Using Alpha-$Al_2O_3$:C," Radiat. Prot. Dosim., 65(1–4), pp 267–272 (1996), the entire contents and disclosures of which are hereby incorporated by reference. Studies of the OSL signal from $Al_2O_3$:C have shown that it is thermally stable and reproducible, with the detection of radiation gamma doses as low as 1 μGy. Optical bleaching may be used to "erase" the information from the material and to make it ready for the next use.

Luminescent materials comprising $Al_2O_3$ and the OSL technique are also used for imaging of radiation fields. See U.S. Pat. No. 6,316,782 to Akselrod, et al., and M. S.

Akselrod, N. Agersnap Larsen and S. W. S. McKeever, "A procedure for the Distinction between Static and Dynamic Radiation Exposures of Personal Radiation badges Using Pulsed Optically Stimulated Luminescence," Radiat. Measurements, v. 32, p.215–225 (2000), the entire contents and disclosures of which are hereby incorporated by reference. In spite of some successful use of $Al_2O_3$:C in OSL imaging this OSL detector material, which has long luminescence lifetime of 35 ms, is not suitable for fast scanning in high spatial resolution radiation field imaging.

Corundum or sapphire ($\alpha$-$Al_2O_3$) is an important technological material in many optical and electronic applications. It is used as a host material for solid-state lasers, as optical windows, as a substrate material in semiconductor epitaxial growth and, more recently, as a radiation detector. These principles have been exploited in the various forms of $\alpha$-$Al_2O_3$, which was introduced as a thermoluminescent dosimeter (TLD) of radiation since the early 1950's, including: Ti-doped $Al_2O_3$, see J. K. Rieke and F. Daniels, Health Phys., Vol. 13, p.798 (1954), W. G. Buckman, "Aluminum oxide thermoluminescence properties for detecting radiation," Health Phys. Vol. 22 p.402, (1972), R. S. McDougall and S. Rudin, "Thermoluminescent dosimetry of aluminum oxide," Health Physics, Vol. 19, pp. 281–283, (1970); $Al_2O_3$ doped with Si and Ti, see W. G. Buckman, "Aluminum oxide thermoluminescence properties for detecting radiation," Health Phys. Vol. 22, p.402, (1972); Mg and Y, see R. S. McDougall and S. Rudin, "Thermoluminescent dosimetry of aluminum oxide," Health Physics, Vol. 19, pp. 281–283, (1970); Cr, see S. K. Mehta and S. Sengupta, Gamma dosimetry using $Al_2O_3$:Si,Ti thermoluminescent phosphor, Phys. Med. Biol., 1976, Vol. 21, No 6, p. 955; and Cr and Ni, see M. Osvay and T. Biro, Nucl. Instr. Meth., Vol. 175, p.60 (1980); D. Lapraz, et al., "Some thermoluminescence of an $\alpha$-$Al_2O_3$ sample," Phys. Stat. Sol. (a), Vol. 108, pp. 783–794, (1988), the entire contents and disclosures of all the above documents are hereby incorporated by reference.

However, aluminum oxide was not sensitive enough as a luminescent material until the introduction of carbon-doped $\alpha$-$Al_2O_3$:C. $Al_2O_3$:C was developed first as an ultra-sensitive TLD in the late 1980's, see M. S. Akselrod, V. S. Kortov, D. J. Kravetsky, V. I. Gotlib, "Highly Sensitive Thermoluminescent Anion-Defective $\alpha$-$Al_2O_3$:C Single Crystal Detectors," Radiat. Prot. Dosim., Vol. 32(1), pp.15–20 (1990), M. S. Akselrod and V. S. Kortov, "Thermoluminescent and Exoemission Properties of New High-Sensitivity TLD $\alpha$-$Al_2O_3$:C Crystals," Radiat. Prot. Dosim., Vol. 33 No.1–4, pp.123–126 (1990), M. S. Akselrod, V. S. Kortov, and E. A. Gorelova, "Preparation and properties of $Al_2O_3$: C," Radiat. Prot. Dosim., Vol. 47, No.1–4, pp. 159–164 (1993), Akselrod M. S. and Gorelova E. A., "Deep Traps in Highly Sensitive ($\alpha$-$Al_2O_3$:C TL Crystals," Nucl. Tracks Radiat. Meas., Vol. 21, No. 1, pp. 143–146 (1993), the entire contents and disclosures of which are hereby incorporated by reference. $Al_2O_3$:C is considered as the most sensitive dosimetric material and is used with newly developed optically stimulated luminescent (OSL) technology, see U.S. Pat. No. 5,892,234 to McKeever, et al., U.S. Pat. No. 5,962,857 to McKeever, et al., U.S. Pat. No. 6,316,782 to Akselrod, et al., U.S. Pat. No. 6,414,324 to Colyott, et al. and S. W. S. McKeever, M. S. Akselrod and B. G. Markey, "Pulsed Optically Stimulated Luminescence Dosimetry Using Alpha-$Al_2O_3$:C," Radiat. Prot. Dosim. 65(1–4), pp. 267–272 (1996), the entire contents and disclosures of which are hereby incorporated by reference. It has the linearity of light output as a function of radiation dose of 7 orders of magnitude with no fading of the information due to the respectively deep traps and extremely good environmental stability. In spite of excellent dosimetric properties of carbon-doped $Al_2O_3$ with oxygen vacancies, the luminescent centers in this material (F-centers) have a very long luminescence lifetime (35 ms).

An important feature of the present invention is the utilization of the electronic and optical properties of a new $Al_2O_3$:C,Mg storage phosphor, its defect structure in an optical technique for performing dosimetric and imaging measurements. An $Al_2O_3$:C,Mg crystalline material utilized in the present invention has color centers for absorbing light, stable traps of electrons and holes. Furthermore, the crystalline material's luminescent centers have a short luminescence lifetime.

The present invention utilizes a luminescent material based on single crystals of aluminum oxide doped with carbon and magnesium ($Al_2O_3$:C,Mg) and containing at least one type of aggregate oxygen vacancy defects for measuring an absorbed dose of photons and charged particles. Storage of dosimetric information is based on ionization of the crystal matrix, generation of free electrons and capture of electrons and holes by traps and color centers.

This invention utilizes nondestructive measurements of fluorescent signals produced as a result of exposure to ionizing radiation (X-rays, gamma rays, or beta particles). Unirradiated $Al_2O_3$ crystals contain high concentration of Type I color centers responsible for the blue absorption band at 435 nm and emission at 520 nm (presumably $F_2^{2+}$(2Mg)-centers) and low concentration of Type II color centers responsible for 335 and 620 nm absorption/excitation bands and 750 nm emission band (presumably $F_2^+$(2Mg)-centers). After exposure to ionizing radiation, the concentration of Type I color centers is reduced and the concentration of Type II color centers is increased.

$Al_2O_3$:C,Mg utilized in this invention contains high concentration of traps and color centers able to capture free electrons generated during irradiation and is able to produce fluorescence under optical excitation. Absorbed dose is determined by the intensity of fluorescence of either Type I color centers (520 nm) or Type II color centers (750 nm). So-called "negative" radiation-induced image is obtained by measuring 520 nm fluorescence from Type I color centers under blue (435±50 nm) light stimulation. The original high intensity of green fluorescence decreases as a function of dose. A more convenient and precise way to perform the measurements is to use so-called "positive" readout mode with fluorescence stimulated from Type II color centers. Illumination of an $Al_2O_3$:C,Mg crystal with red laser (for example He—Ne 633 nm laser or laser diodes with wavelength at 635 or 650 nm) produces 750 nm fluorescence with intensity dependent on irradiation dose.

This invention utilizes nondestructive measurements of fluorescent signals produced as a result of exposure to ionizing radiation (X-rays, gamma rays, or beta particles). Unirradiated $Al_2O_3$ crystals contain high concentration of Type I color centers responsible for the blue absorption band at 435 nm and emission at 520 nm (presumably $F_2^{2+}$(2Mg)-centers) and low concentration of Type II color centers responsible for 335 and 620 nm absorption/excitation bands and 750 nm emission band (presumably $F_{2+}$(2Mg)-centers). After exposure to ionizing radiation, the concentration of Type I color centers is reduced and the concentration of Type II color centers is increased. In one embodiment, the luminescent material of the present invention may have one or more color centers having absorption bands in the region of 335±5 nm and 620±10 nm, an emission in the region of 750±5 nm and a 75±10 ns fluorescence lifetime. In another embodiment of the present invention, the luminescent material of the present invention may be exposed to a light source having a wavelength in the range between 290 to 380 nm. In yet another embodiment of the present invention, the luminescent material of the present invention may be exposed to a light source having a wavelength in the range between 300 to 370 nm. In yet another embodiment, the luminescent material may be exposed to a light source having a wavelength in the range between 550 and 700 nm.

In a second system, stimulation light is provided by a a red laser diode 142 having wavelength 650 nm. An illumination beam 146 (indicated by dashed lines) goes through an excitation filter 150 into sample chamber 112, where illumination beam 146 illuminates sample 114 placed on the sample holder (not shown). An electromechanical shutter 152 controls the illumination time. Fluorescent light 118 (indicated by dashed lines) emitted from sample 114 is filtered with an emission filter 120 and is detected by PMT 122. Signal 124 from PMT 122 is amplified by the transimpedance amplifier (not shown) and is measured by a data acquisition board (not shown) and personal computer 130.

Personal computer 130 is used to control red laser diode 142, shutters 116 and 152, deuterium lamp 102 by means of electrical and/or data communication connections 162, 164, 166 and 168, respectively.

Preferably the personal computer in the setup illustrated in FIG. 1. controls experiments using software designed in LabView environment.

Magnesium and carbon doped $Al_2O_3$ crystals used in the method described in the present invention have been grown according to the method described in a U.S. application Ser. No. 10/309,021, filed Dec. 4, 2002, entitled, "Aluminum Oxide Material for Optical Data Storage," the entire contents and disclosures of which are hereby incorporated by reference. Samples of the crystals having concentration of Mg from 3 to 27 ppm were cut from the grown crystal boules to obtain plates $7\times7\times1$ mm$^3$ and were polished on two sides to perform optical measurements. Powders of $Al_2O_3$:C,Mg with the grain size below 38 μm needed to produce imaging plates were obtained by grinding of single crystals.

Optical properties of $Al_2O_3$:C,Mg crystals were investigated to obtain optimum parameters for laser light stimulation and fluorescence detection. $Al_2O_3$:C,Mg crystals have the same main absorption bands as a regular dosimetric $Al_2O_3$:C OSL material. A strong optical absorption band (OA band) with a maximum at 205 nm is characteristic to neutral F-centers (two electrons occupying oxygen vacancy), whereas two bands at 230 and 255 nm are assigned to $F^+$ centers (one electron on oxygen vacancy). Concentration of $F^+$-centers in Mg doped crystals, see FIG. 2, is much higher than in regular dosimetric $Al_2O_3$:C crystals.

The $Al_2O_3$:C,Mg single crystals are characterized by several new OA bands with a blue absorption band responsible for the visible green coloration of the crystals. The new material has double oxygen vacancies in the form of $F_2^{2+}$ centers, charge-compensated by the nearby Mg-impurity atoms. The aggregate defect composed of two oxygen vacancies and two Mg-impurity atoms with two localized electrons, is denoted here as $F_2^{2+}$ (2Mg). It is responsible for a blue absorption-excitation band at 435 nm, produces green fluorescence centered at 520 mm, and has a short fluorescent lifetime of 9±3 ns Other OA bands at 335, 520 and 620 nm appear in Mg-doped aluminum oxide as a result of gamma, beta, X-ray or laser irradiation. For example, FIG. 2 illustrates the absorption spectra of $Al_2O_3$:C and $Al_2O_3$:C,Mg dosimetric crystals. The $Al_2O_3$:C,Mg crystal is characterized by a blue 435 nm absorption band undergoing photochromic transformation in to 335 and 620 nm absorption bands. It has been suggested that 335 and 620 nm bands can be assigned to the same aggregate oxygen vacancy defect only in different charge states created when electron produced during ionization is captured by $F_2^{2+}$(2Mg)-center converting it into three-electron $F_2^+$(2Mg)-center:

The $Al_2O_3$:C,Mg single crystals are characterized by several new OA bands with a blue absorption band responsible for the visible green coloration of the crystals. The new material has double oxygen vacancies in the form of $F_2^{2+}$ centers, charge-compensated by the nearby Mg-impurity atoms. The aggregate defect composed of two oxygen vacancies and two Mg-impurity atoms with two localized electrons, is denoted here as $F_2^{2+}$(2Mg). It is responsible for a blue absorption-excitation band at 435 nm, produces green fluorescence centered at 520 nm, and has a short fluorescent lifetime of 9±3 ns. In one embodiment of the present invention, fluorescent light may be emitted from luminescent material at a wavelength in the range between 450 and 600 nm and centered at 520±10 nm. In another embodiment of the present invention, the luminescent material may be exposed to a light source having a wavelength in the range between 370 to 490 nm. In yet another embodiment of the present invention, the luminescent material may have one or more color centers having an absorption in the region of 435±5 nm, an emission in the region of 520±5 nm and a 9±3 ns fluorescence lifetime.

Figure 2:
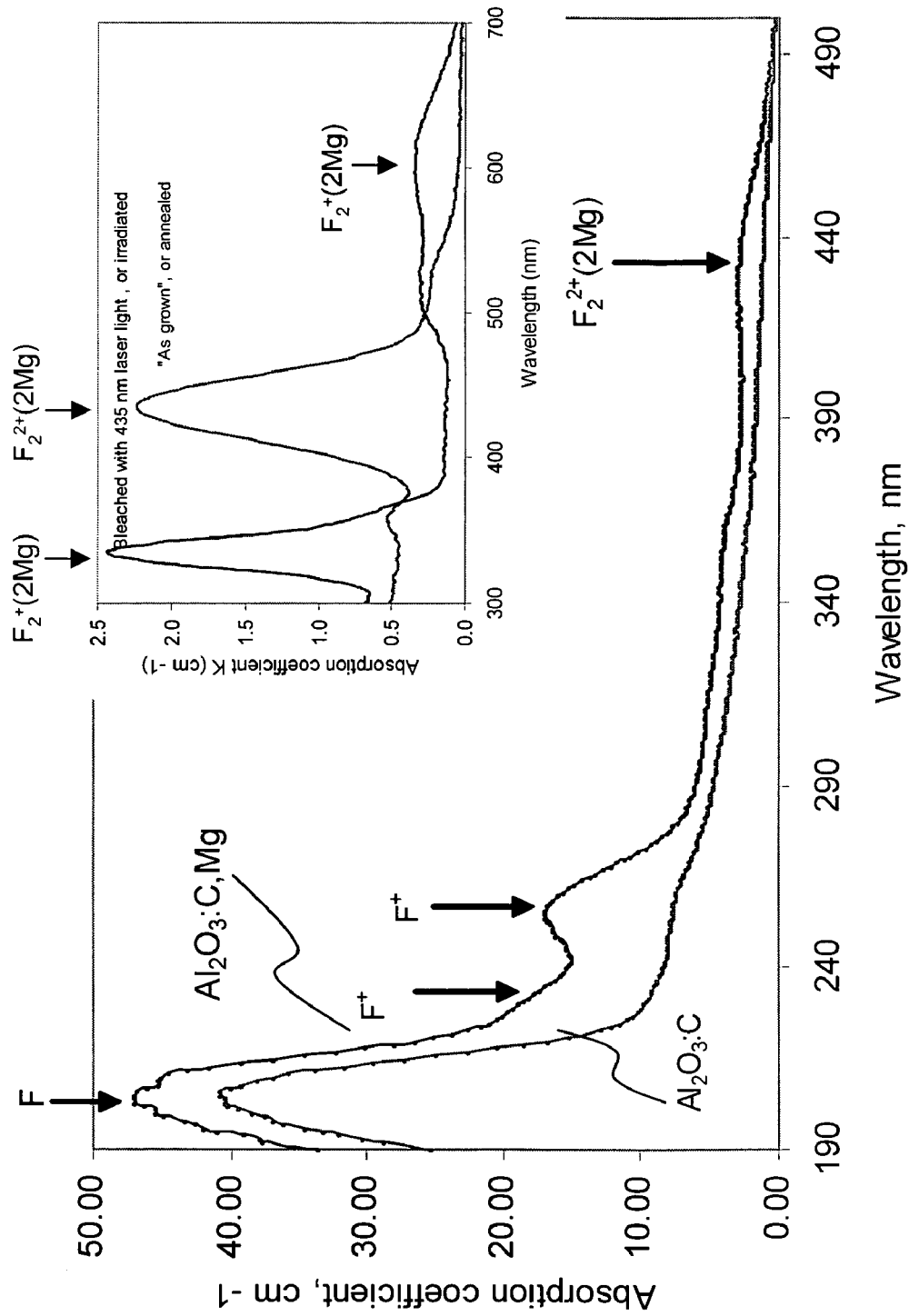
FIG. 2 is a graph illustrating the absorption spectra of $Al_2O_3$:C and $Al_2O_3$:C,Mg dosimetric crystals. $Al_2O_3$:C,Mg crystal is characterized by a blue 435 nm absorption band undergoing photochromic transformation in in to 335 and 620 nm absorption bands.
Figure 3A:
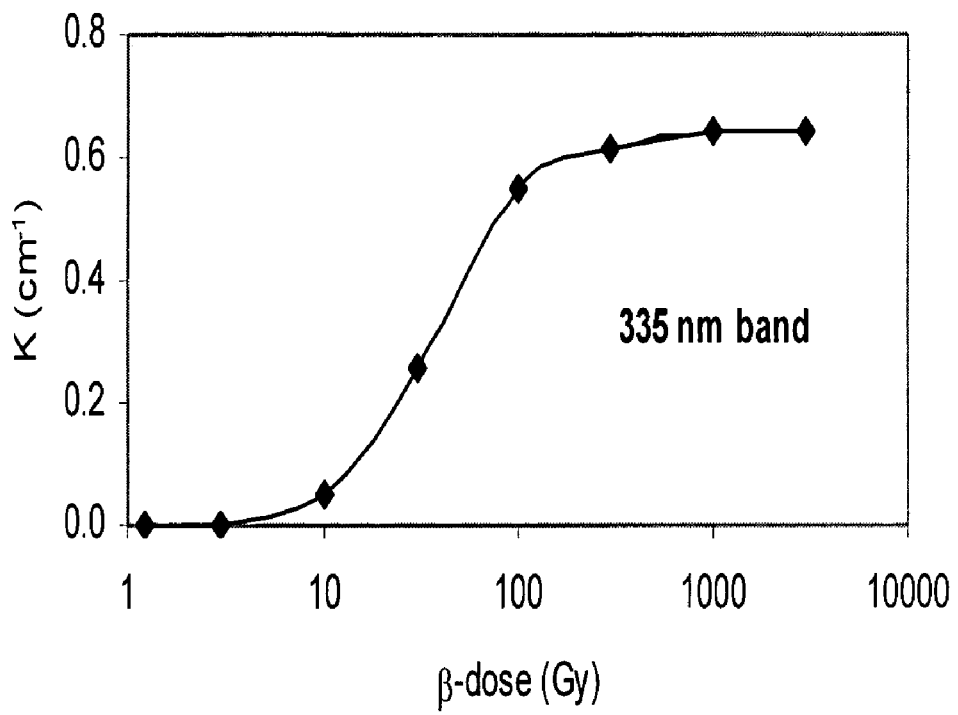
FIG. 3A is a graph illustrating an increase in intensity of 335 nm absorption band as a function of a beta dose.
Figure 3B:
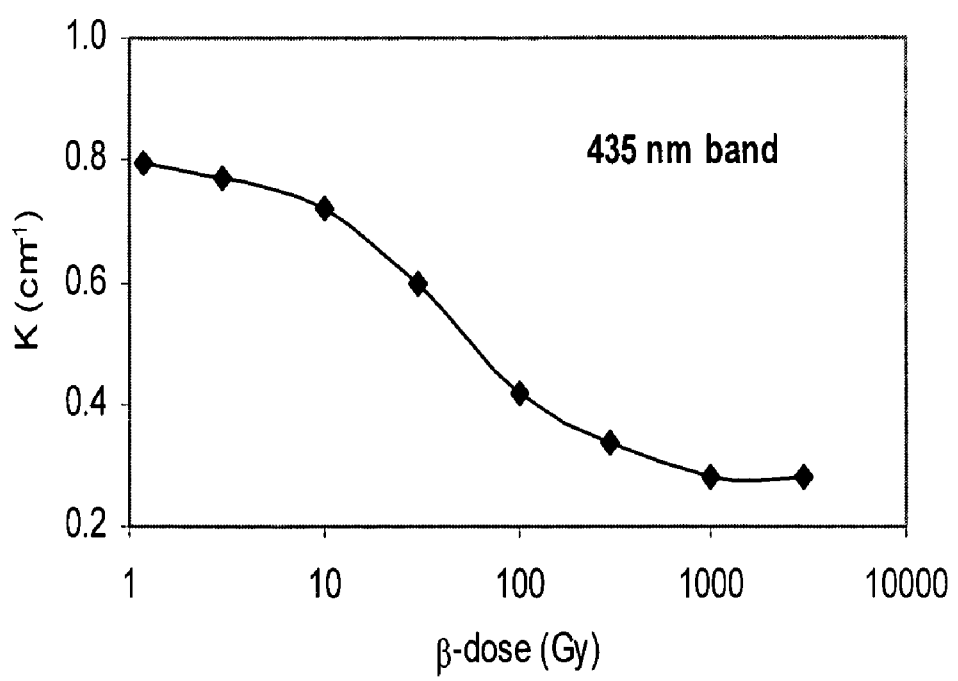
FIG. 3B is a graph illustrating a decrease in intensity of 435 nm absorption band as a function of a beta dose.

It was shown in a large number of experiments that 435 nm band can be converted into 335 mm band either by laser light, see FIG. 2, or by β-irradiation, see FIG. 3. The latter result illustrates the change in optical properties that is used in present invention as methods for radiation dosimetry and imaging.

Intensity of both 335 nm and 435 nm absorption bands strongly depends on dose of X-ray and β-irradiation, see FIG. 3. As the dose increases 435 nm band intensity gradually decreases and the sample loses its green coloration. On the contrary, 335 nm band intensity increases. These changes take place due to the conversion of $F_2^{2+}$(2Mg)-center into $F_2^+$(2Mg)-center.

In spite of wide use of optical density measurements of silver-halide photographic and radiochromic films in radiation dosimetry, optical absorption in general is not a very sensitive and convenient method of radiation dosimetry. Luminescent technique is more sensitive, it is faster and provides wider dynamic range of data acquisition.

Figure 4:
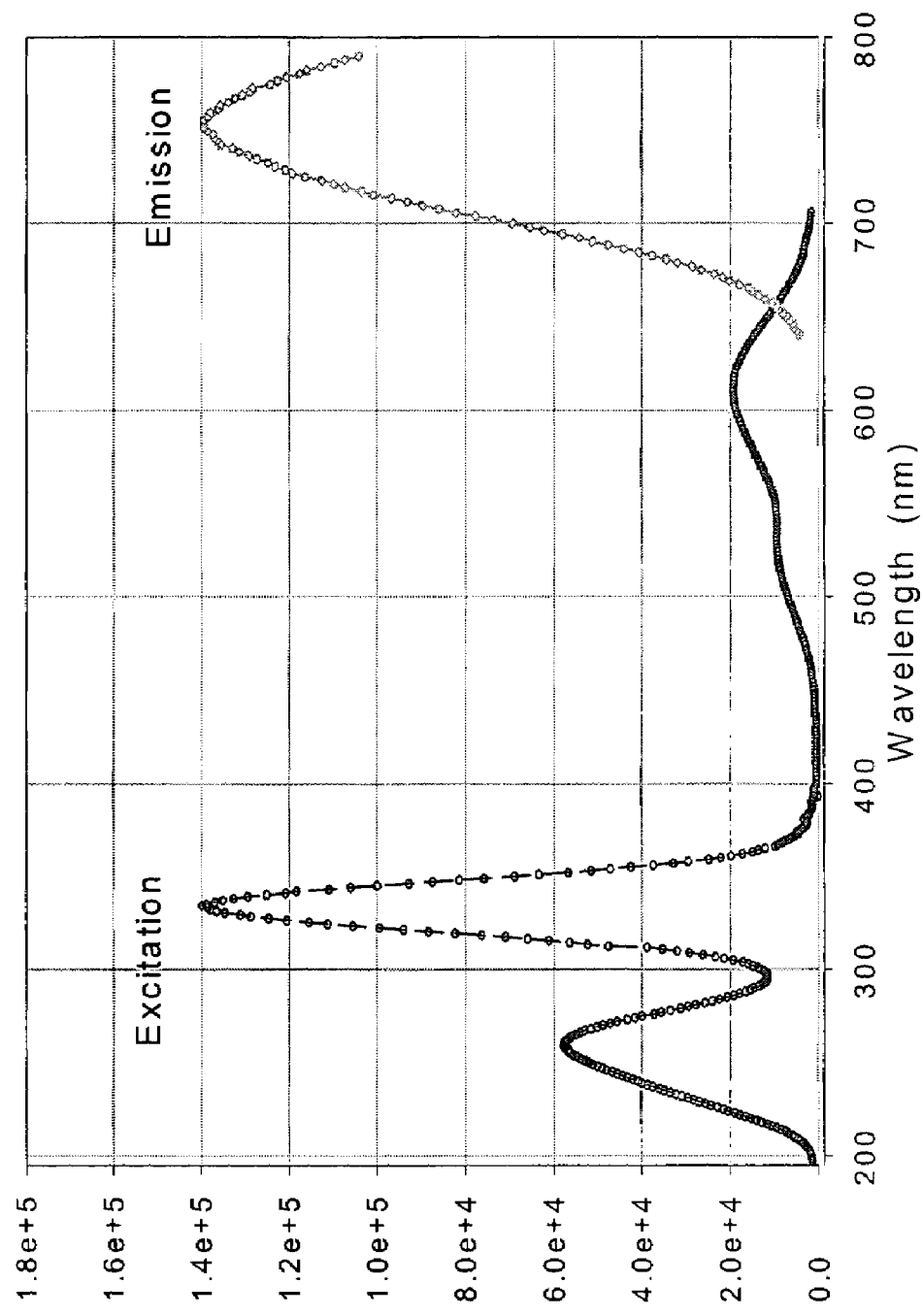
FIG. 4 is a graph showing the excitation and emission spectra of $F_2^+(2Mg)$-centers created in $Al_2O_3$:C,Mg, with excitation bands at 335 and 620 nm and emission band at 750 nm$^{-1}$ that may be used in a radiation dosimetry embodiment of the present invention.
Figure 5:
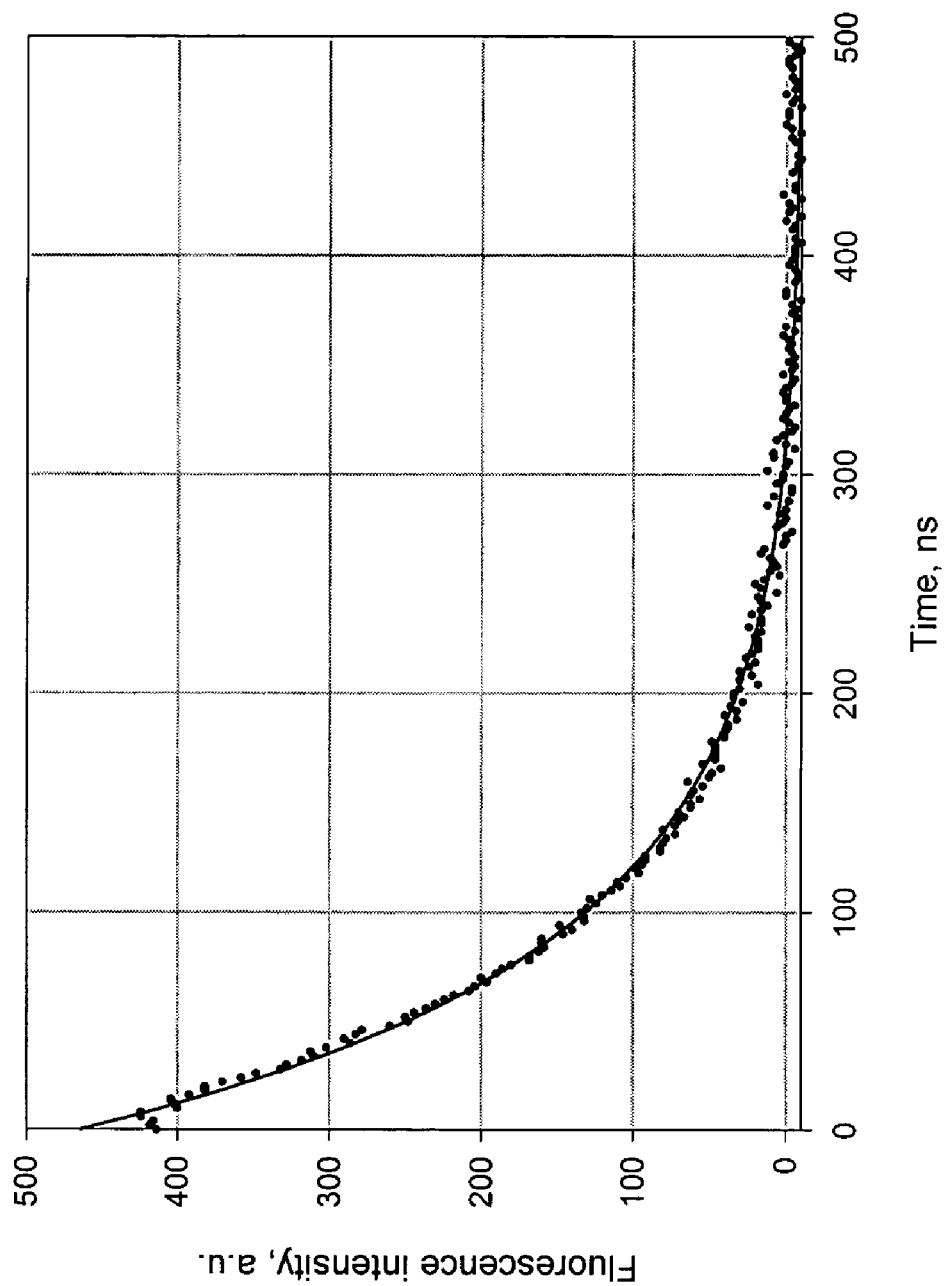
FIG. 5 is a graph showing the decay of 750 nm fluorescence after pulsed red laser excitation with the lifetime of 75 ns.

Fluorescence of $F_2^+$(2Mg)-centers in $Al_2O_3$:C,Mg luminescent material created as a result of irradiation can be used as a basis for radiation dosimetry and radiation imaging application. Investigation of $F_2^+$(2Mg)-centers behavior showed, that these centers produce a broad fluorescence emission at 750 nm under either 335 nm or 620 nm light stimulation, see FIG. 4. The fluorescence lifetime of these centers is relatively small with the exponential decay time equal to 75±5 ns, see FIG. 5, and it is short enough for fast data processing and imaging using laser scanning at the data transfer rate up to 10 Mb/s.

A preferred mode of reading operation of the present invention will now be described. After exposure to ionizing radiation the detector comprising $Al_2O_3$:C,Mg luminescent crystal is moved to a desired position with respect to a stimulation light beam. It may have the wavelength in the region of 335 or 620 nm corresponding to radiation induced absorption bands, with the most preferred wavelength equal to 635 nm corresponding to commercially available laser diodes. Then, the detector or an imaging storage screen are illuminated with the above described stimulation light beam for the period of time equal to a "read" time. The "read" time is in the range of 10 ns to 1 s with the most preferred time equal to 200 ns (approximately 3 fluorescence lifetimes). The laser-induced fluorescence produced by the $Al_2O_3$:C, Mg detector material is then measured using a photodetector. The above-described laser induced fluorescence is the "data" light at the wavelength in the region of 750 nm and is in the range from 650 nm to 900 nm. The above-described fluorescent signal is then processed to obtain the value of the dose.

The present invention also allows parallel processing of the radiation induced image by using multiple scanning laser beams or one-dimensional or two-dimensional arrays of lasers and photo-detectors (CCD chips or CMOS detectors).

Figure 6:
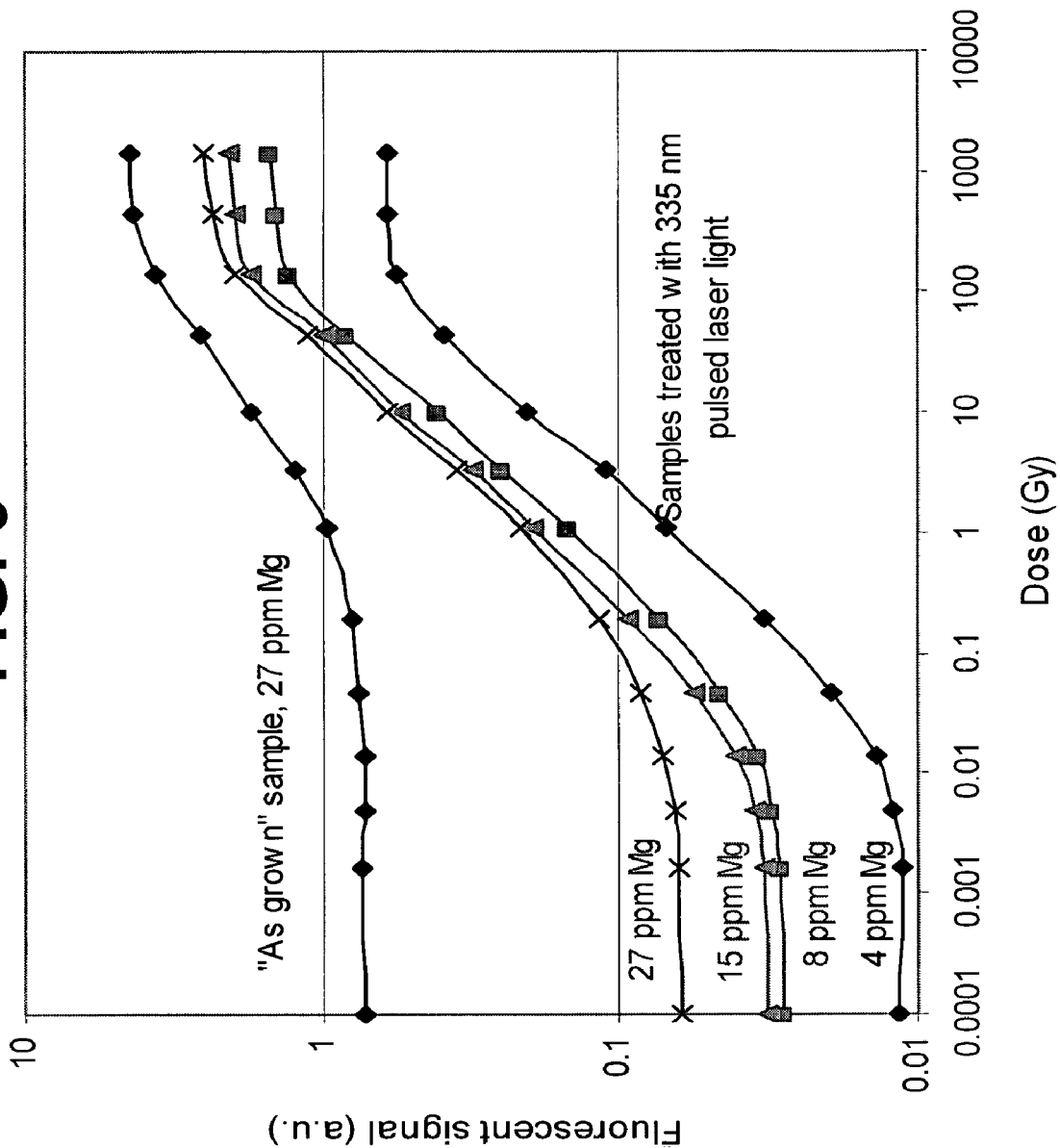
FIG. 6 shows dependence of 750 nm fluorescence on radiation dose for several samples of $Al_2O_3$:C,Mg crystals doped with different amount of Mg before and after treatment with 335 nm pulsed laser light.

Fluorescent signals obtained according to the method of the present invention strongly depends on the dose of irradiation, see FIG. 6. After calibration procedure this signal is used as a measure of the absorbed dose. The useful dose range depends on the intensity of a background signal.

According to another embodiment of the present invention the background signal may be significantly reduced by illumination of the detector material with a pulsed laser light having a wavelength in the range of absorption bands 335 nm or 620 nm. It was found that the background signal is produced by a small amount of $F_2^+$(2Mg)-centers in "as-grown" crystals. The above described procedure of laser illumination eliminates these centers using two-photon absorption and photo-conversion of $F_2^+$(2Mg)-centers into $F_2^{2+}$(2Mg)-centers. Dose range of fluorescent measurements was expanded almost 10 times and minimum detectable dose was found to be about 5 mGy.

The present invention also encompasses using the same procedure of illumination with pulsed 335±50 laser light to erase the stored information and to reset the dosimeter material.

Figure 7:
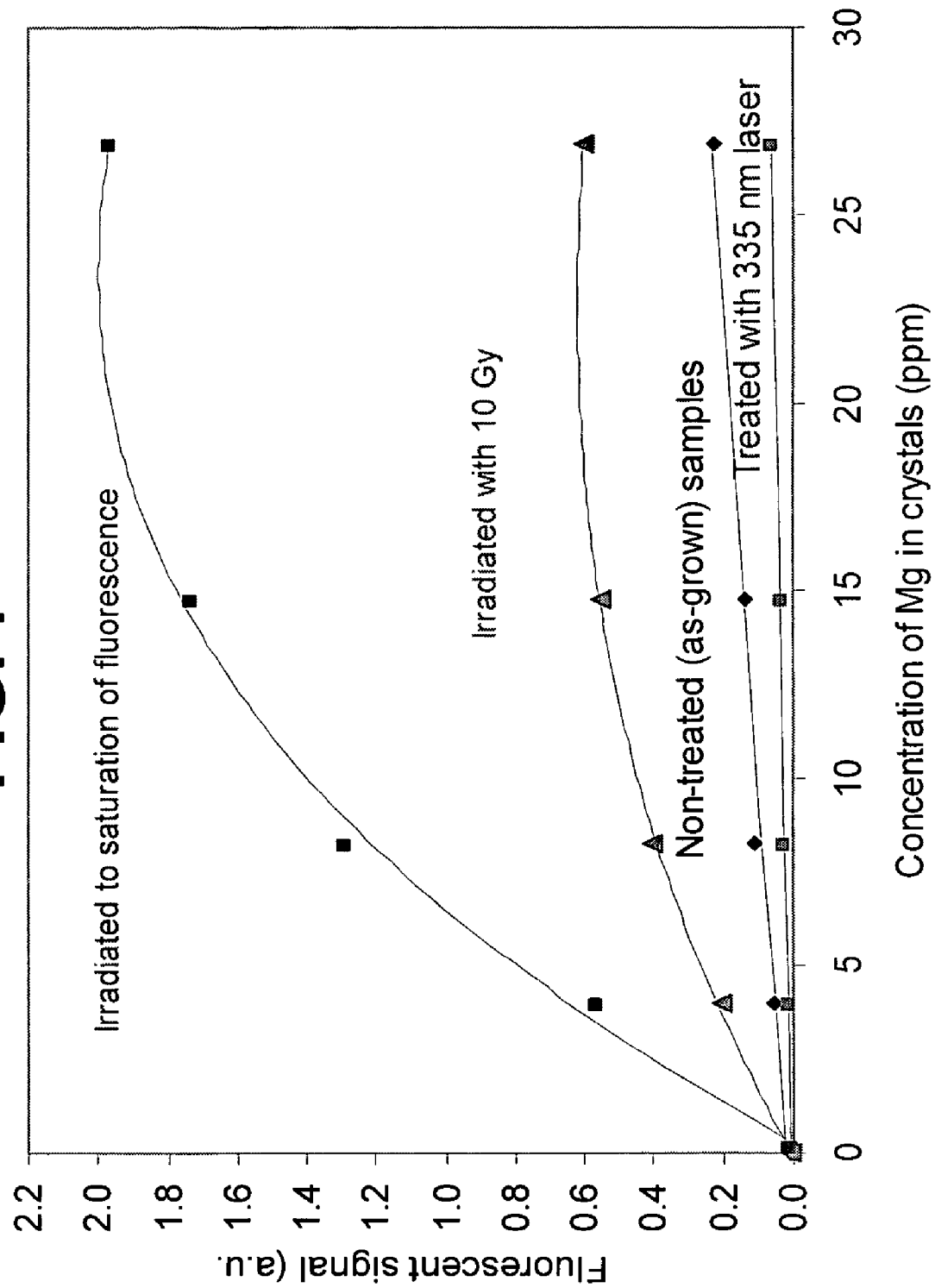
FIG. 7 is a graph illustrating the dependence of the fluorescent intensity (background signal, signal after 10 Gy of irradiation, and signal at saturation) as a function of Mg-impurity concentration in $Al_2O_3$:C,Mg crystals.

Crystals doped with different concentrations of Mg-impurity show significant increase in fluorescence intensity with the increase of concentration of Mg, see FIG. 7. At the same time the useful dose range does not change significantly with the increase of Mg concentration. Both background signal and saturation signal increase at the same time keeping the dose range practically the same. Still according to the present invention higher concentration of Mg in the detector material and stronger fluorescence signal are generally favorable and allow for higher precision and faster processing time.

The radiation dosimetry and imaging method of the present invention also provides thermal, temporal and environmental stability both of the detector material and the stored data. A common problem for fluorescent materials is that they are thermally unstable, resulting in thermal erasure of stored information even at room temperature. $Al_2O_3$ doped with carbon and magnesium exhibits extremely good thermal and temporal stability of information stored as electrons trapped in localized states formed by oxygen vacancy defects in the crystal structure. Lifetime of the charge carriers in traps depends on storage temperature. The higher the temperature—the smaller the lifetime. The deeper the traps—the longer the storage time. Most of the trapped electrons are associated with a trap having delocalization temperature near 650° C., This trap has extremely high thermal and optical depth, see FIG. 8. $Al_2O_3$:C, Mg crystals are very mechanically, chemically and optically stable and do not show degradation of performance for years.

Multiple non-destructive readouts can be performed according to the present invention in condition of one photon absorption. This condition is achieved by a relatively lower laser power of the readout beam, see FIG. 9. It was also shown that the stored radiation-induced fluorescence cannot be erased by conventional room light illumination and a luminescent detector or an imaging screen does not require light protection.

In a preferred embodiment of the present invention, the $Al_2O_3$:C,Mg crystalline material is capable of being used as a detector in radiation dosimetry.

In another preferred embodiment of the present invention, the $Al_2O_3$:C,Mg crystalline material is capable of being used for non-destructive readout in radiation dosimetry.

In another preferred embodiment of the present invention, the $Al_2O_3$:C,Mg crystalline material is substantially insensitive to room light both before and after irradiation.

The present invention will now be described by the way of examples. The example experiments described below are meant to be illustrative of the material and procedure described above and should not be considered to be definitive descriptions of the invention.

EXAMPLE I

Three non-polished samples 7×7×1 mm were cut from the central part of $Al_2O_3$:C,Mg crystal. Concentration of Mg in the crystal was determined by spectrum analysis and equals to 27 ppm. The "as-grown" crystal has green coloration due to optical absorption at 435 nm band. The background fluorescence signals from non-irradiated samples were measured and then the samples were exposed to successively increasing doses up to 1000 Gy of X-rays and of $^{90}$Sr source beta source. The correction for the over-response of aluminum oxide to soft X-ray irradiation was performed.

Fluorescence measurements were performed using experimental setup depicted in FIG. 1. Three measurements from each of the three experimental samples after every dose of irradiation were taken. $F_2^+$(2Mg)-centers produce a broad fluorescence emission at 750 nm under 335 or 620 nm excitation, see FIG. 4. In order to collect maximum fluorescence light and to avoid high background signal due to possible excitation of other centers, proper filtering of excitation and emission light was achieved. UV excitation in a 335 nm absorption band was performed using a 337.1 nm interference filter. Diode laser light was filtered with a cut-off Kopp-2403 glass filter having 50% transmission at 640 nm. A cut-off glass filter RG665 nm was used in front of the PMT to separate emission and excitation light. The average standard deviation of fluorescent intensity measurements did not exceed 3%.

FIG. 6 presents the dose dependence of fluorescence signal from $Al_2O_3$:C,Mg crystals. The lowest measurable dose of radiation equals approximately to 0.05 Gy. The fluorescence signal comes to saturation at approximately 200 Gy.

EXAMPLE II

Method of reduction of the background signal and the low dose detection limit was tested. The main obstacle to achieve lower dose detection limit is the existence of a residual fluorescence signal from non-irradiated "as-grown" samples. The background signal comes from a small number of three electron $F_2^+$(2Mg)-centers, which exist in "as-grown" crystals in addition to the main $F_2^{2+}$(2Mg)-centers.

To decrease the intensity of the background fluorescent signal $Al_2O_3$:C,Mg samples with different concentrations of Mg impurity were illuminated with pulsed laser light from a Continuum Panther optical parametric oscillator. The pulsed laser light was tuned to 335 nm wavelength corresponding to the maximum absorption of $F_2^+$(2Mg)-centers. The exposure time was 5 min at the average power of 6 mW. As a result of this treatment the background fluorescence signal was reduced from 5 to 10 times and the low dose limit was decreased down to 5 mGy.

EXAMPLE III

Radiation dose dependence of fluorescence signal was determined. Four samples of $Al_2O_3$:C,Mg crystals with different concentration of Mg impurity in the range from 3 to 27 ppm were tested and showed similar dose dependence but different sensitivity, see FIG. 6. For all tested samples four decades of the dose range useful for fluorescent measurements were obtained. Higher concentration of Mg impurity produces higher intensity of fluorescence, but at the same time it produces higher background signal.

Radiation dose dependence of 750 nm fluorescence signal was measured before and after laser bleaching procedure for several samples having different concentrations of Mg-impurity, see FIG. 7. It was shown that all three major parameters: the background fluorescence signal, the sensitivity to test 10 Gy dose, and the saturation dose strongly depend on the concentration of Mg in the crystal. The results indicate that the fluorescence at 750 nm is related to Mg-associated color centers.

EXAMPLE IV

Erasure of radiation induced fluorescence signal and restoration of original optical properties of $Al_2O_3$:C,Mg crystal were demonstrated. As shown in FIG. 3, under irradiation the photochromic transformation of OA bands takes place. The intensity of OA band centered at 435 nm reduces and the intensity of 335 nm OA band increases as a function of the dose. Reverse photochromic transformation was performed by pulsed 335 nm laser light. Thermal annealing the $Al_2O_3$:C,Mg crystal to 650±30° C. also results in restoration of the initial intensity of 435 nm OA band and 520 nm fluorescence.

Figure 8:
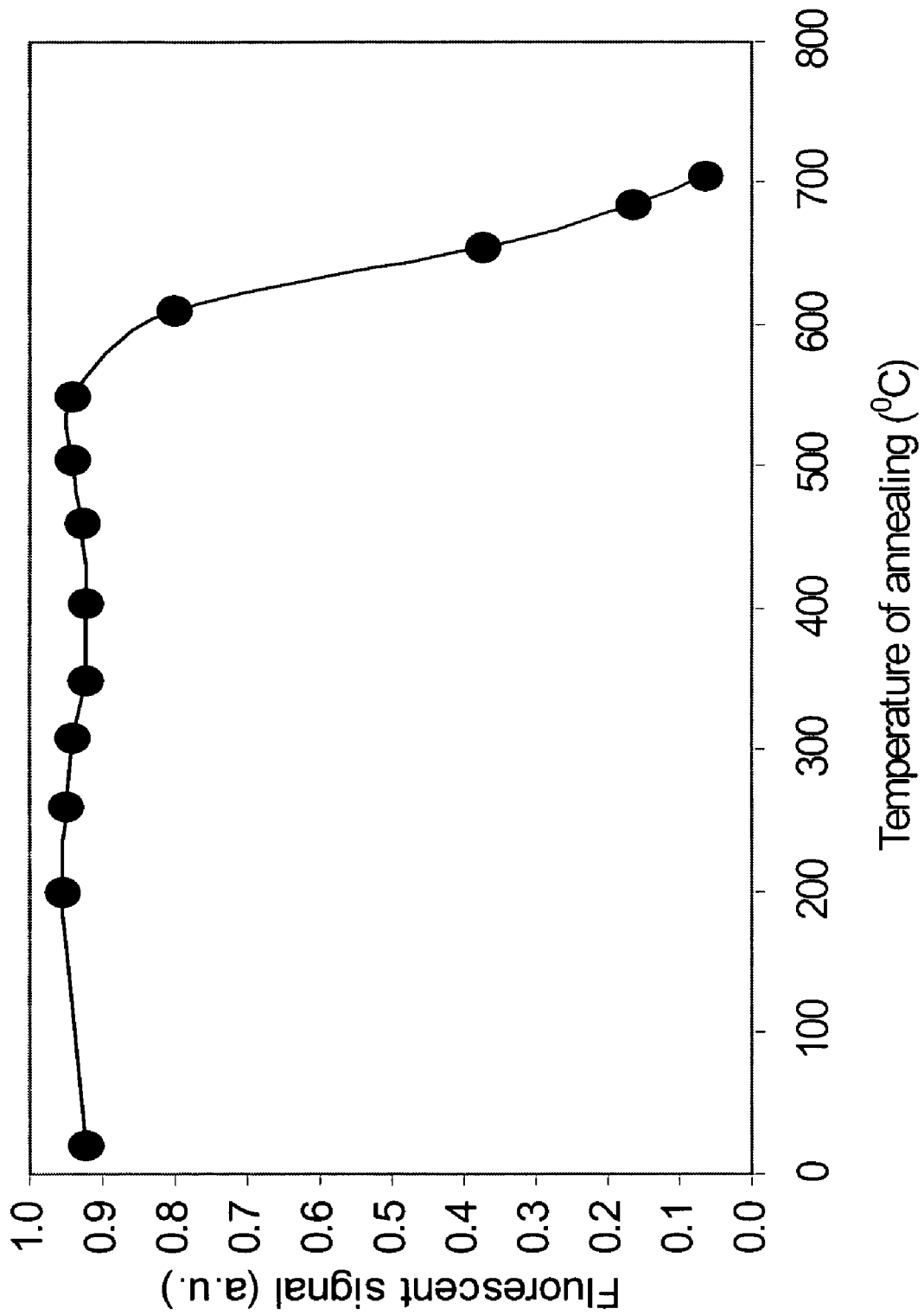
FIG. 8 is a graph illustrating temperature stability of radiation induced fluorescent signal up to 600° C.

Stability of deep traps responsible for storage of radiation information was tested by measuring the intensity of 750 nm fluorescence as a function of the annealing temperature, see FIG. 8. Erasure of radiation induced fluorescence signal and complete restoration of initial low level of fluorescence takes place at the same temperature around 680° C. obtained from the OA measurements.

Optical erasure of the radiation-induced fluorescence signal was tested on a sample with the highest concentration of Mg (27 ppm) and the highest near-IR fluorescence signal after irradiation. After exposure to 3000 Gy of beta radiation the sample was illuminated with 335 nm pulsed laser light for 5 min at 6 mW of average laser power. This procedure uses sequential two-photon absorption process. This procedure completely erases the fluorescence signal from the detector and restores its original green coloration caused by the blue absorption band.

EXAMPLE V

One of the main advantages of the present invention is its capability to non-destructive reading of radiation-induced fluorescent signal multiple times. To illustrate that continuous readout of 750 nm fluorescence signal stimulation with 650 nm laser diode was performed using the experimental setup, see FIG. 1 described above. The results illustrated in FIG. 9 show good stability of both background and radiation-induced fluorescence during 100 s of exposure to 1 mW of 650 nm laser light. Taking into account that the decay time of 750 nm fluorescence equals to 75 ns, see FIG. 5. 100 s of continuous illumination corresponds to approximately 10 billion of the shortest possible readouts of information. This feature is important for dose verification, because multiple readouts can be used for improving SNR in the imaging application by averaging several images obtained from the same imaging screen.

These examples show that crystals of $Al_2O_3$:C doped with Mg can be used as a material for fluorescence dosimetry and imaging. The useful dose range is between approximately 0.005 and 200 Gy. A low dose detection limit and a higher dynamic range can be achieved by treating of "as-grown" crystals with a pulsed laser having 335±30 nm wavelength. Fluorescence signal from irradiated crystals can be erased either by annealing them to 680±50° C. or by illuminating the samples with 335 nm pulsed laser light.

The main advantages of the present invention in comparison with existing materials and techniques for radiation dosimetry are: method of readout is nondestructive and produces high sensitivity and precision by utilizing multiple scanning (imaging) and accumulation of the fluorescence signal; method utilizes fast readout due to the fact that it uses only electronic transitions and short fluorescence lifetime of color centers; method utilizes very simple passive detectors without a battery and readout electronics, and relatively simple apparatus for automatic processing of a large number of detectors; and method allows using of detectors unprotected from room light. Exposure to direct sunlight and deep-UV sources should be avoided because UV light may ionize deep color centers and alter the 750 nm fluorescence signal.

The present invention allows for high temperature measurements of absorbed dose due to high temperature stability of traps and time stability of stored data. Fluorescence response to radiation is not linear dependent on the dose but still has a good dynamic range, making the fluorescent response technique useful in several applications in radiation dosimetry and radiation imaging. Also, a saturation dose of about 200 Gy is sufficient for many radiation applications including radiotherapy.

All documents, patents, journal articles and other materials cited in the present application are hereby incorporated by reference.

It is important to emphasize that the invention is not limited in its application to the detail of the particular material and technological steps illustrated herein. The invention is capable of other embodiments and of being practiced or carried out in a variety of ways. It is to be understood that the phraseology and terminology employed herein is for the purpose of description and not of limitation.

All documents, patents, journal articles and other materials cited in the present application are hereby incorporated by reference.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A method of measuring a dose of ionizing radiation comprising the following steps:
   (a) exposing a luminescent material to ionizing radiation to form an irradiated luminescent material;
   (b) exposing said irradiated luminescent material to a light source to form an excited luminescent material;
   (c) detecting fluorescent light emitted by said excited luminescent material to thereby determine the amount of fluorescent light emission induced by step (a); and
   (d) determining said dose of ionizing radiation from the amount of fluorescent light detected in step (c) using calibration data, wherein said luminescent material comprises: a base material comprising $Al_2O_3$, a first dopant comprising Mg, and a second dopant comprising C and wherein said luminescent material has at least one type of aggregate oxygen vacancy defect.

2. The method of claim 1, wherein said calibration data is obtained by exposing said luminescent material to said ionizing radiation in a standard radiation field for a known period of time and detecting the amount of fluorescent light emitted after exposing said luminescent material to said light source.

3. The method of claim 1, wherein steps (b) and (c) are conducted simultaneously.

4. The method of claim 1, wherein said fluorescent light has a wavelength in the range between 650 and 900 nm and has a peak of emission band around 750 nm.

5. The method of claim 4, wherein said light source has a wavelength in the range between 290 to 380 nm.

6. The method of claim 4, wherein said light source has a wavelength of 335 nm.

7. The method of claim 4, wherein said light source has a wavelength in the range between 550 to 700 nm.

8. The method of claim 4, wherein said light source has a wavelength of 635 nm.

9. The method of claim 1, wherein said at least one oxygen vacancy defect comprises at least one color center having absorption bands in the region of 335±5 nm and 620±10 nm, an emission in the region of 750±15 nm and a 75±10 ns fluorescence lifetime.

10. The method of claim 1, wherein said fluorescent light has a wavelength in the range between 450 and 600 nm and centered at 520±10 nm.

11. The method of claim 10, wherein said light source has a wavelength in the range between 370 to 490 nm.

12. The method of claim 10, wherein said light source has a wavelength around 435 nm.

13. The method of claim 1, wherein said at least one oxygen vacancy defect comprises at least one color center having an absorption in the region of 435±5 nm, an emission in the region of 520±5 nm and a 9±3 ns fluorescence lifetime.

14. The method of claim 1, wherein said ionizing radiation comprises at least one member of the group consisting of: x-rays photons, gamma photons, beta particles, alpha particles or protons.

15. The method of claim 1, wherein, said luminescent material is essentially insensitive to room light before and after exposure to said ionizing radiation.

16. The method of claim 1, wherein said luminescent material includes a plurality of said aggregate oxygen vacancy defects in which is stored dosimetric information and said dosimetric information is essentially insensitive to heating up to at least 600° C.

17. A method of erasing dosimetric information comprising the following steps:
   (a) providing an irradiated luminescent material including color centers induced by radiation; and
   (b) illuminating said irradiated luminescent material with light having sufficient intensity to perform a two-photon absorption and ionization of said color centers induced by radiation, wherein said luminescent material comprises: a base material comprising $Al_2O_3$, a first dopant comprising Mg, a second dopant comprising C, and wherein said luminescent material has at least one type of aggregate oxygen vacancy defect.

18. The method of claim 17, wherein said light has a wavelength in the range between 290 and 380 nm.

19. The method of claim 17, wherein said light has a wavelength around 335 nm.

20. The method of claim 17, wherein said light has a wavelength in the range between 550 and 700 nm.

21. The method of claim 17, wherein said light has a wavelength around 635 nm.

22. A method of erasing dosimetric information comprising the following steps:
   (a) providing an irradiated luminescent material including color centers induced by radiation; and
   (b) annealing said irradiated luminescent material at 680±50° C. for at least 1 minute to empty deep traps filled during irradiation, wherein said luminescent material comprises:
a base material comprising $Al_2O_3$, a first dopant comprising Mg, a second dopant comprising C and wherein said luminescent material has at least one type of aggregate oxygen vacancy defect.

23. A method of obtaining radiation field image comprising the following steps:
   (a) exposing at least one imaging plate in a radiation field to form at least one irradiated imaging plate;
   (b) exposing said irradiated imaging plate to a light source to form a light exposed imaging plate; and
   (c) measuring spatial distribution of fluorescent light produced by said imaging plate to obtain said radiation field image, wherein said imaging plate is comprised of a luminescent material, said luminescent material comprising: a base material comprising $Al_2O_3$, a first dopant comprising Mg, and a second dopant comprising C and wherein said luminescent materials has at least one type of aggregate oxygen vacancy defect.

24. The method of claim 23, wherein said at least one imaging plate comprises a plurality of imaging plates.

25. The method of claim 23, wherein said light source performs scanning of a surface of said imaging plate.

26. The method of claim 23, wherein said light source illuminates the surface of said imaging plate substantially uniformly.

27. The method of claim 23, wherein light from said light source has a wavelength in the region of 635 nm, and said fluorescent light has a wavelength in the region of 750 nm and a fluorescence lifetime of 75±10 ns.

28. The method of claim 23, wherein light from said light source has a wavelength in the region of 435 nm, and said fluorescent light has a wavelength in the region of 520 nm and a fluorescence lifetime of 9±3 ns.

* * * * *